United States Patent [19]
Hauck et al.

[11] Patent Number: 5,367,209
[45] Date of Patent: Nov. 22, 1994

[54] FIELD PROGRAMMABLE GATE ARRAY FOR SYNCHRONOUS AND ASYNCHRONOUS OPERATION

[76] Inventors: Scott A. Hauck, 5219 22nd Ave. NE., #4, Seattle, Wash. 98105; Gaetano Borriello, 8045 Bagley Ave. N., Seattle, Wash. 98103; Steven M. Burns, 6033 31st Ave. NE., Seattle, Wash. 98115; William H. C. Ebeling, 4002 Burke Ave. N., Seattle, Wash. 98103

[21] Appl. No.: 56,434

[22] Filed: Apr. 30, 1993

Related U.S. Application Data

[63] Continuation-in-part of Ser. No. 817,697, Jan. 7, 1992, Pat. No. 5,208,491.

[51] Int. Cl.$^5$ .......................... H03K 19/173
[52] U.S. Cl. .......................... 326/45; 326/39
[58] Field of Search .................... 307/465-469; 340/825.83

[56] References Cited

U.S. PATENT DOCUMENTS

| | | | |
|---|---|---|---|
| 4,293,783 | 10/1981 | Patil | 307/465 |
| 4,918,440 | 4/1990 | Furtek | 340/825.83 |
| 4,969,121 | 11/1990 | Chan | 307/465 |
| 5,089,973 | 2/1992 | Furtek | 364/489 |
| 5,208,491 | 5/1993 | Ebeling | 307/465.1 |

*Primary Examiner*—Edward P. Westin
*Assistant Examiner*—Andrew Sanders
*Attorney, Agent, or Firm*—Christensen, O'Connor, Johnson & Kindness

[57] ABSTRACT

A field programmable gate array (FPGA) including both routing and logic blocks (RLBs) and routing and arbiter blocks (RABs) is disclosed. The RABs are periodically placed throughout the FPGA and operate either to arbitrate the arrival of simultaneous signals or to synchronize simultaneous signals. In addition, each of the RLBs are capable of operating in accordance with two clock signals and an asynchronous initialization. The combination of the RLBs and RABs allow the FPGA to operate synchronously and asynchronously.

18 Claims, 8 Drawing Sheets

FIELD PROGRAMMABLE GATE ARRAY FOR SYNCHRONOUS AND ASYNCHRONOUS OPERATION

The U.S. Government may have certain rights to the present invention under Contract no. N00014-J-91-4041.

This is a continuation-in-part of co-pending U.S. patent application Ser. No. 07/817,697, Jan. 7, 1992, now U.S. Pat. No. 5,208,491 which is herein incorporated by reference.

FIELD OF THE INVENTION

The present invention relates to a field programmable gate array and, more particularly, to a field programmable gate array capable of supporting both synchronous and asynchronous operation.

BACKGROUND OF THE INVENTION

One large class of integrated circuits are the programmable integrated circuits. Programmable integrated circuits feature the advantage of flexibility, i.e., a programmable integrated circuit may be used to implement any number of different complex digital logic circuits by varying the specific programming of the integrated circuit. A digital logic circuit is an electrical circuit that produces a digital output as a logic function of digital inputs. By digital output and digital input, it is meant that an output or input is either one ("high") or zero ("low"). Examples of logic functions are AND, OR, NAND, and XOR. Typically, a digital logic circuit is formed from a cascade of separate logic functions. The terms signal propagation, input signals, and output signals as used herein all refer to the propagation of signals that are digital in nature.

Another important advantage of programmable integrated circuits is the generally lower cost of manufacture. By mass producing a large number of programmable integrated circuits from a single integrated circuit mask design, the design costs of a programmable integrated circuit may be distributed over a large number of circuits. The present invention is directed towards a programmable integrated circuit. In particular, the present invention is a field programmable gate array (FPGA), one type of programmable integrated circuit. Unlike other programmable integrated circuits which are programmed shortly after manufacture at the production site (such as mask programmable gate arrays (MPGAs)), FPGAs are programmed in the field by the user.

The programming of the circuits may be accomplished using antifuse programming technology or memory, programming technology. For example, as is well known in the art, anti-fuse programming involves the physical modification of the programmable integrated circuit so as to connect or disconnect logical elements within the integrated circuit. Memory programming involves setting a plurality of memory bits in the integrated circuit. The memory bits in turn control the connection of logical elements in the integrated circuit. In general, antifuse programmed devices can operate at faster speeds than memory programmed devices. Moreover, anti-fuse programmed devices need only be programmed once and the device will operate indefinitely. In contrast, the advantage of memory programming is that the integrated circuit may be reprogrammed an indefinite number of times. Moreover, because of programming by use of memory bits, each time the integrated circuit is deactivated, in order to operate correctly when reactivated, the integrated circuit must be reprogrammed.

Whether antifuse programmed or memory programmed, an FPGA typically consists of an array of modularized logic blocks and interconnection resources. Each logic block can be programmed to implement a particular logic function. Typically, the logic blocks are arranged in a two-dimensional array, consisting of a plurality of columns of logic blocks. Interconnect resources occupy the space between the columns and rows of the logic blocks. The desired path of signal propagation is accomplished by means of the interconnect resources. The term topology is used to describe the particular arrangement of logic blocks and the interconnect resources. By programming a plurality of logic blocks to implement logic functions and utilizing the interconnect resources to connect them in the proper manner, a desired digital logic circuit can be implemented.

Although FPGAs can be used for many different digital applications, one increasingly important application of FPGAs is for the interfacing of different synchronous electronic digital components. With different synchronous electronic components operating at different clock speeds, in order to interface between separately clocked components, the FPGA must be able to effectively accommodate signals that originate at varying rates. In such a case, the FPGA must be able to operate asynchronously. Also, special circuit components, known as synchronizers, are necessary to regulate communication between the two systems. Interfacing a synchronous circuit to the environment requires similar features from an FPGA.

Another increasingly important use for FPGAs capable of asynchronous operation is for prototyping purposes. Asynchronous FPGAs are particularly useful as a platform for designing and testing asynchronous circuit designs. By providing a programmable platform for design of asynchronous circuits, an inexpensive method of design and testing of asynchronous circuits is provided.

SUMMARY OF THE INVENTION

The present invention provides an FPGA capable of operating both asynchronously and synchronously. In particular, certain select logic blocks of the FPGA are replaced with arbiter blocks capable of implementing an arbiter, enabled arbiter, or synchronizer. Unlike prior art homogenous FPGAs, the present invention discloses a heterogenous FPGA having both logic blocks and arbiter blocks. The arbiter blocks each include a mutual exclusion logic element. The element provides the capability of acting as an arbiter, i.e., reliably providing an output that is based upon the first arriving input signal.

In the preferred embodiment the FPGA includes a plurality of routing and logic blocks (RLBs) and a plurality of routing and arbiter blocks (RABs). The RLBs provide both routing of signals and an output which is a logical function of its inputs. The KABs provide both routing of signals and an output that is based upon its first arriving input.

The FPGA includes routing and logic blocks (RLBs) and vertical segmented routing channels. The RLBs are categorized as either forwardly propagating RLBs (FPRLBs) or backwardly propagating RLBs (BPRLBs). The FPRLBs and BPRLBs intermesh with one another to form a two-dimensional checkerboard array. Thus, each column of the RLB array comprises a plurality of FPRLBs and BPRLBs in alternating sequence. Similarly, each row of the RLB array comprises a plurality of FPRLBs and BPRLBs in alternating sequence.

The FPRLBs forwardly propagate signals, in a left to right direction. Each FPRLB may receive a plurality of input signals from a plurality of FPRLBs in the preceding leftward column. Moreover, each FPRLB may transmit a plurality of output signals to a plurality of FPRLBs in the next rightward column. Further, each FPRLB may receive input signals from and transmit output signals to the two BPRLBs in the same column and directly above and below the FPRLB.

Similarly, the BPRLBs backwardly propagate signals, in a Right-to-left direction. Each BPRLB may receive a plurality of input signals from a plurality of BPRLBs in the preceding rightward column and transmit a plurality of output signals to a plurality of BPRLBs in the next leftward column. Each BPRLB may receive input signals from and transmit output signals to the two FPRLBs in the same column and directly above and below the BPRLB.

A plurality of vertical segmented routing channels (SRCs) serve as signal bus lines between RLBs. The segmented routing channels are categorized as either forwardly propagating SRCs (FPSRCs) or backwardly propagating SRCs (BPSRCs). One FPSRC and one BPSRC is disposed between adjacent columns of RLBs. Each FPRLB transmits an output signal to the immediately adjacent FPSRC to the right. Further, each FPRLB receives an input signal from the immediately adjacent FPSRC to the left. Similarly, each BPRLB transmits an output signal to the immediately adjacent BPSRC to the left. Each BPRLB also receives an input signal from the immediately adjacent BPSRC to the right. Moreover, a predetermined number of the BPRLBs and FPRLBs are substituted therewith by RABs.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

It must be noted at the outset that the following detailed description of the present invention is in the context of one particular FPGA topology. It can be appreciated that the present invention can be applied equally well to other types of FPGA topologies, including, but not limited to those FPGAs manufactured by Xilinx Corp., Actel Corp., Plessey Corp., and Concurrent Logic, Inc. Indeed, as will be seen below, unlike any FPGAs in the prior art, a primary aspect of the present invention is the provision of a non-homogenous set of logic blocks. In particular, the present invention teaches the provision of not only logic blocks that can provide an output as a logical function of a set of inputs, the present invention teaches the inclusion of arbiter blocks which are crucial to asynchronous operation. Thus, unlike any prior art FPGAs, the present invention provides a heterogeneous FPGA where one type of element is an arbiter.

Figure 1:
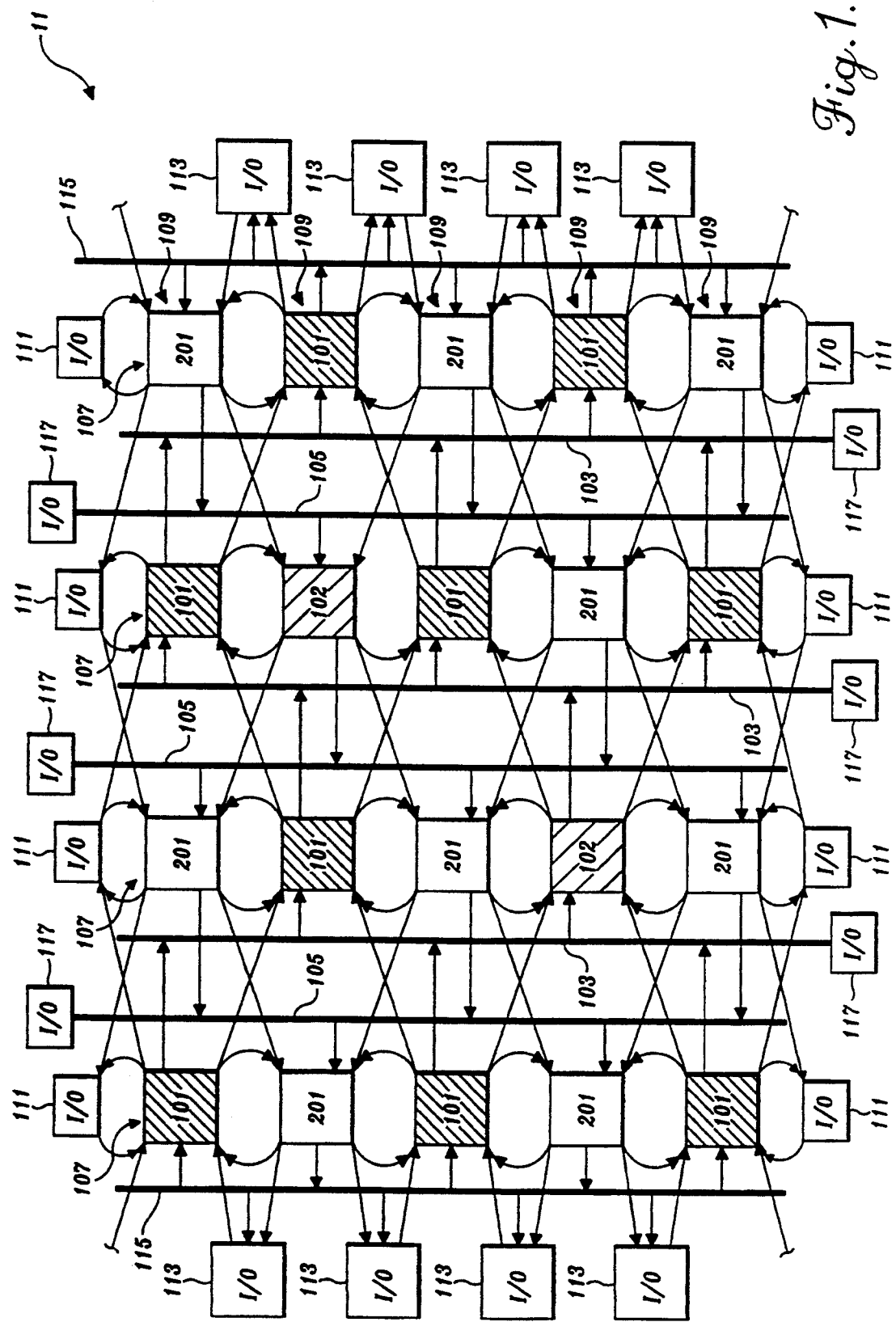
FIG. 1 illustrates the preferred FPGA topology for use with the present invention.

Referring to FIG. 1, a field programmable gate array (FPGA) 11 comprises a plurality of routing and logic blocks (RLBs) 101 and 201, a plurality of routing and arbiter blocks (RABs) 102, a plurality of forwardly propagating segmented routing channels (FPSRCs) 103, a plurality of backwardly propagating segmented routing channels (BPSRCs) 105, a plurality of top-bottom I/O pads 111, a plurality of side I/O pads 113, a plurality of routing channel I/O pads 117, and two side segmented routing channels 115.

In FIG. 1, two RABs 102 are shown along with eighteen RLBs 101 and 201. The ratio of RABs to RLBs shown in FIG. 1 is larger than optimal, nevertheless for clarity, two RABs are shown. In the preferred embodiment, the ratio of the number of RABs 102 to the number of RLBs 101 and 201 is typically very low, on the order of 1:15 or one RAB 102 for every fifteen RLBs. Furthermore, the exact number, dispersal and placement of the RABs within FPGA 11 is not crucial. However, it is preferred that the RABs be evenly distributed within the FPGA 11. This even distribution of RABs 102 within the FPGA 11 is not unlike the technique of doping silicon or gallium with a different material to achieve a desired property, such as semiconductivity. The RABs can be thought of as substituting for certain RLBs within a normally homogenous array of RLBs. Thus, in a homogenous FPGA, as described in co-pending U.S. patent application Ser. No. 07/817,697, the RLBs are uniformly arranged in an array. However, an FPGA incorporating the present invention includes RABs which substitute for and "dope" a typical homogenous FPGA.

Before proceeding with a detailed description of the internal structures of the RLBs 101 and 102 and the RABs 102, it is beneficial to provide a detailed description of the preferred FPGA topology as shown in FIG. 1. As noted above however, the specific FPGA topology described is not intended to be limiting, but rather illustrative. Other FPGA topologies can easily incorporate the present invention.

For clarity, the following describes a homogenous FPGA. It will be understood that to implement the present invention, various RLBs in the homogenous FPGA may be substituted therefor by a predetermined number of RABs 102. As will be seen below, because the RABs 102 are very similar in many respects with the RLBs 101 and 201 substitution is easily accomplished without any disruption to the layout of the FPGA 11.

As noted previously, the RLBs described herein not only compute logic functions, but may also be used for routing purposes. The description herein of RLBs that are capable of both routing and logic functions should not be construed as limiting. It is contemplated that the present invention may be applied to various FPGA topologies where the logic blocks do not perform routing functions. Similarly, the herein description of the RABs contemplates that the RABs perform both routing and arbiter functions. In the preferred embodiment which includes the preferred FPGA topology, it is advantageous to provide the RABs with routing abilities like the RLBs. One advantage is to be able to maintain the spatial size of the RABs comparable to that of the RLBs in order to more easily construct the FPGA. Nevertheless, the RABs may be constructed so that the routing functions are not incorporated into the RABs, in which case the RABs are more accurately referred to as arbiter blocks or ABs. Thus, in sum, the crucial aspect of the present invention is the inclusion of apparatus within the FPGA to perform an arbiter function. As will be seen below, it is further advantageous for the same apparatus that performs the arbiter function to perform an enabled arbiter function or a synchronizer function.

Referring to FIG. 1, the RLBs 101 and 201, although identical in internal structure, are categorized as either forwardly propagating RLBs (FPRLB)101 or backwardly propagating RLBs (BPRLB)201. The FPRLBs 101 provide for signal flow in the forward direction. The term forward direction refers to signal propagation from left to right in FIG. 1. The BPRLBs 201 provide for signal flow in the backward direction. The term backward direction refers to signal propagation from right to left in FIG. 1. The combination of the FPRLBs 101 and the BPRLBs 201 allow for the implementation of digital logic circuits that require feedback.

FPRLBs 101 and BPRLBs 201 are arranged in intermeshing fashion, and when taken together, form a two-dimensional checkerboard array of RLBs. Thus, each of the RLB columns 107 contain a plurality of FPRLBs 101 and BPRLBs 201 in alternating sequence. Similarly, each of the RLB rows 109 contain a plurality of FPRLBs 101 and BPRLBs 201 in alternating sequence. For clarity, only four columns and five rows of RLBs are shown in FIG. 1. However, it can be appreciated that the array may be extended to arbitrary size.

Disposed between each pair of adjacent columns of RLBs are FPSRCs 103 and BPSRCs 105. FPSRCs 103 and BPSRCs 105 provide routing channels for propagating signals between RIBs. Although both the FPSRCs 103 and BPSRCs 105 are shown in FIG. 1 as a single line, each FPSRC 103 and BPSRC 105 includes multiple separate bus lines. In the preferred embodiment, the FPSRCs 103 and the BPSRCs 105 include seven bus lines. As will be seen with greater clarity below, the seven bus lines provide for signal propagation between RLBs.

Neighbor Interconnect Structure of the FPRLBs

Figure 5:
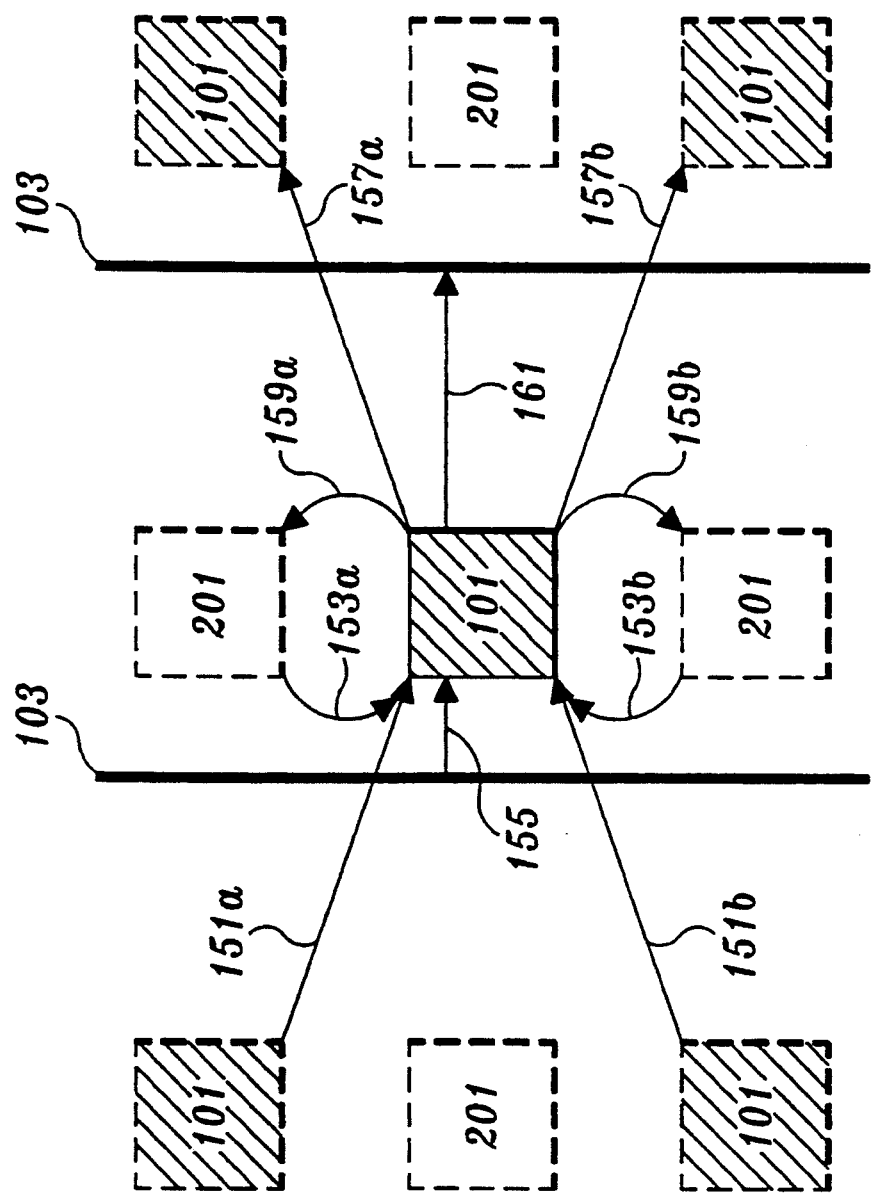
FIG. 5 illustrates the neighbor interconnect structure of a FPRLB used in the FPGA of FIG. 1.

Apart from the FPSRCs 103 and the BPSRCs 105, signal propagation to and from RLBs may also be carried out using a neighbor interconnect structure. Each RLB (and RABs substituted therefor) in the FPGA 11 has an associated neighbor interconnect structure. Referring to FIG. 5, an expanded schematic illustration of the FPGA topology of FIG. 1 is shown. As seen, the neighbor interconnect structure of a FPRLB 101 (shown in solid outline) comprises diagonal input interconnects 151a and 151b, vertical input interconnects 153a and 153b, FPSRC input interconnect 155, diagonal output interconnects 157a and 157b, vertical output interconnects 159a and 159b, and FPSRC output interconnect 161.

The neighbor interconnect structure allows each FPRLB 101 to receive input from five different sources. In particular, diagonal input interconnect 151a carries an input signal from the FPRLB 101 that is located in the immediately adjacent column to the left and in the immediately adjacent row above. Diagonal input interconnect 151b carries an input signal from the FPRLB 101 that is located in the immediately adjacent column to the left and in the immediately adjacent row below. Further, vertical input interconnect 153a carries an input signal from the BPRLB 201 in the same column and immediately above the FPRLB 101. Vertical input interconnect 153b carries an input signal from the BPRLB 201 in the same column and immediately below the FPRLB 101. Finally, FPSRC input interconnect 155 carries an input signal from the immediately adjacent FPSRC 103 to the left.

As noted earlier, the FPSRC 103 comprises seven bus lines. The FPSRC input interconnect 155 accesses all seven of the bus lines. As will be seen below, a programmable multiplexer within each FPRLB allows the selection of one bus line to provide an input signal to the FPRLB. However, for clarity, each FPRLB 101 is shown as having a single FPSRC input interconnect 155. Thus, it can be appreciated that the single FPSRC input interconnect 155 is actually seven distinct interconnects, one to each bus line.

Each FPRLB 101 can supply three separate output signals to five separate destinations. In particular, diagonal output interconnect 157a carries a first output signal to the FPRLB 101 in the immediately adjacent column to the right and to the row above. The same first output signal is carried by vertical output interconnect 159a to the BPRLB 201 directly above in the same column. The second output signal is carried by diagonal output interconnect 157b to the FPRLB 101 in the immediately adjacent column to the right and to the row below. The same second output signal is carried by vertical output interconnect 159b to the BPRLB 201 directly below in the same column. Finally, the third output signal is carried by FPSRC output interconnect 161 to the immediately adjacent FPSRC 103 to the right.

More particularly, the FPSRC output interconnect 161 supplies the third output signal to all seven bus lines of FPSRC 103. Specifically, as will be seen below, the third output signal is provided to seven tri-state buffers 315 (seen in FIG. 2) that act as a switch to control the output signal to the seven bus lines of the FPSRC 103. For clarity, each FPRLB 101 is shown as having a single FPSRC output interconnect 161. However it can be appreciated that the single FPSRC output interconnect 161 is actually seven distinct interconnects, one to each of the seven bus lines.

The above description discloses that each FPRLB 101 has a neighbor interconnect structure comprised of diagonal input interconnects 151a and 151b, vertical input interconnects 153a and 153b, FPSRC input interconnect 155, diagonal output interconnects 157a and 157b, vertical output interconnects 159a and 159b, and a FPSRC output interconnect 161. However, because of the interconnection of the FPRLBs and the repetitive nature of the FPGA topology, the neighbor interconnect structure of a specific FPRLB 101 overlaps with the neighbor interconnect structure of other FPRLBs 101 and the neighbor interconnect structure of other BPRLBs 201. Specifically, the diagonal output interconnects 157 of one FPRLB are the diagonal input interconnects 151 of other FPRLBs 101. Similarly, the vertical output interconnects 159 of one FPRLB are the vertical input interconnects 173 of other BPRLBs 201.

Neighbor Interconnect Structure of the BPRLBs

Figure 6:
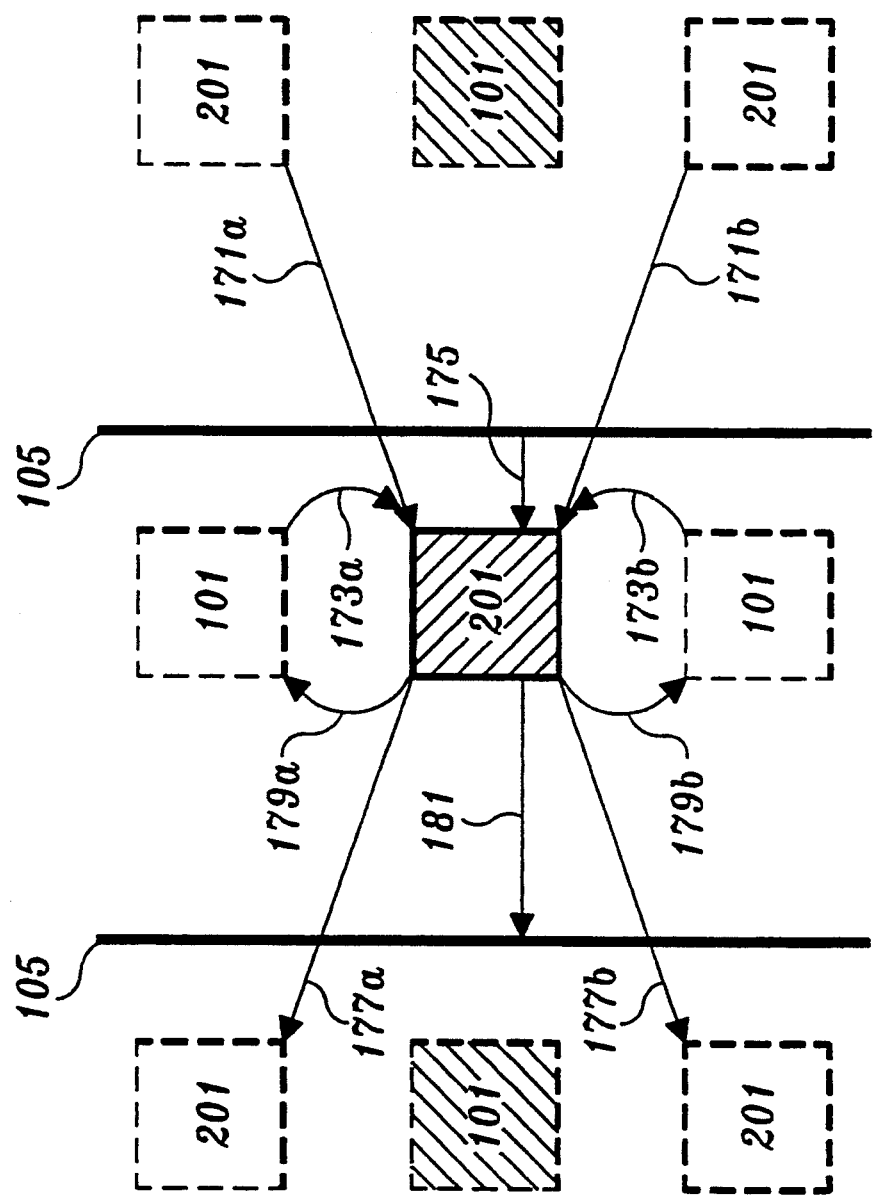
FIG. 6 illustrates the neighbor interconnect structure of a BPRLB used in the FPGA of FIG. 1.

The neighbor interconnect structure of the BPRLBs 201 is analogous to the neighbor interconnect structure of the FPRLBs 101. Referring to FIG. 6, a neighbor interconnect structure comprises diagonal input interconnects 171a and 171b, vertical input interconnects 173a and 173b, BPSRC input interconnect 175, diagonal output interconnects 177a and 177b, vertical output interconnects 179a and 179b, and BPSRC output interconnect 181.

The neighbor interconnect structure allows each BPRLB 201 to receive input from five different sources. In particular, diagonal input interconnect 171a carries an input signal from the BPRLB 201 that is located in the immediately adjacent column to the right and in the immediately adjacent row above. Also, diagonal input interconnect 171b carries an input signal from the BPRLB 201 that is located in the immediately adjacent column to the right and in the immediately adjacent row below. Further, vertical input interconnect 173a carries an input signal from the FPRLB 101 in the same column and immediately above the BPRLB 201. Vertical input interconnect 173b carries an input signal from the FPRLB 101 in the same column and immediately below the BPRLB 101. Finally, BPSRC input interconnect 175 carries an input signal from the immediately adjacent BPSRC 105 to the right.

Like the FPSRC 103, the BPSRC 105 comprises seven bus lines. The BPSRC input interconnect 175 accesses all seven of the bus lines. As will be seen below, a programmable multiplexer within each BPRLB allows the selection of one bus line to provide an input signal to the BPRLB. However, for clarity, each BPRLB 201 is shown as having a single BPSRC input interconnect 175. Thus, it can be appreciated that the single BPSRC input interconnect 175 is actually seven distinct interconnects, one to each bus line.

Each BPRLB 201 can supply three separate output signals to five separate destinations. In particular, diagonal output interconnect 177a carries a first output signal to the BPRLB 201 in the immediately adjacent column to the left and to the row above. The same first output signal is carried by vertical output interconnect 179a to the FPRLB 101 directly above in the same column. The second output signal is carried by diagonal output interconnect 177b to the BPRLB 201 in the immediately adjacent column to the left and to the row below. The same second output signal is carried by vertical output interconnect 179b to the FPRLB 101 directly below in the same column. Finally, the third output signal is carried by BPSRC output interconnect 181 to the immediately adjacent BPSRC 105 to the right.

The BPSRC output interconnect 181 supplies the third output signal to the seven bus lines of BPSRC 105. Specifically, as will be seen below, the third output signal is provided to seven tri-state buffers 315 that act as a switch to control the application of the output signal to the seven bus lines of the BPSRC 105. For clarity, each BPRLB 201 is shown as having a single BPSRC output interconnect 181. However, it can be appreciated that the single BPSRC output interconnect 181 is actually seven distinct interconnects, one to each of the seven bus lines.

The above description discloses that each BPRLB 201 has a neighbor interconnect structure comprised of diagonal input interconnects 171a and 171b, vertical input interconnects 173a and 173b, BPSRC input interconnect 175, diagonal output interconnects 177a and 177b, vertical output interconnects 179a and 179b, and a BPSRC output interconnect 181. However, because of the interconnection of the BPRLBs and the repetitive nature of the FPGA topology, the neighbor interconnect structure of a specific BPRLB 201 overlaps with the neighbor interconnect structure of other BPRLBs 201 and the neighbor interconnect structure of other FPRLBs 101. Specifically, the diagonal output interconnects 177 of one BPRLB are the diagonal input interconnects 171 of other BPRLBs 201. Similarly, the vertical output interconnects 179 of one BPRLB are the vertical input interconnects 153 of other FPRLBs 101.

Segmented Routing Channel Structure

Figure 8:
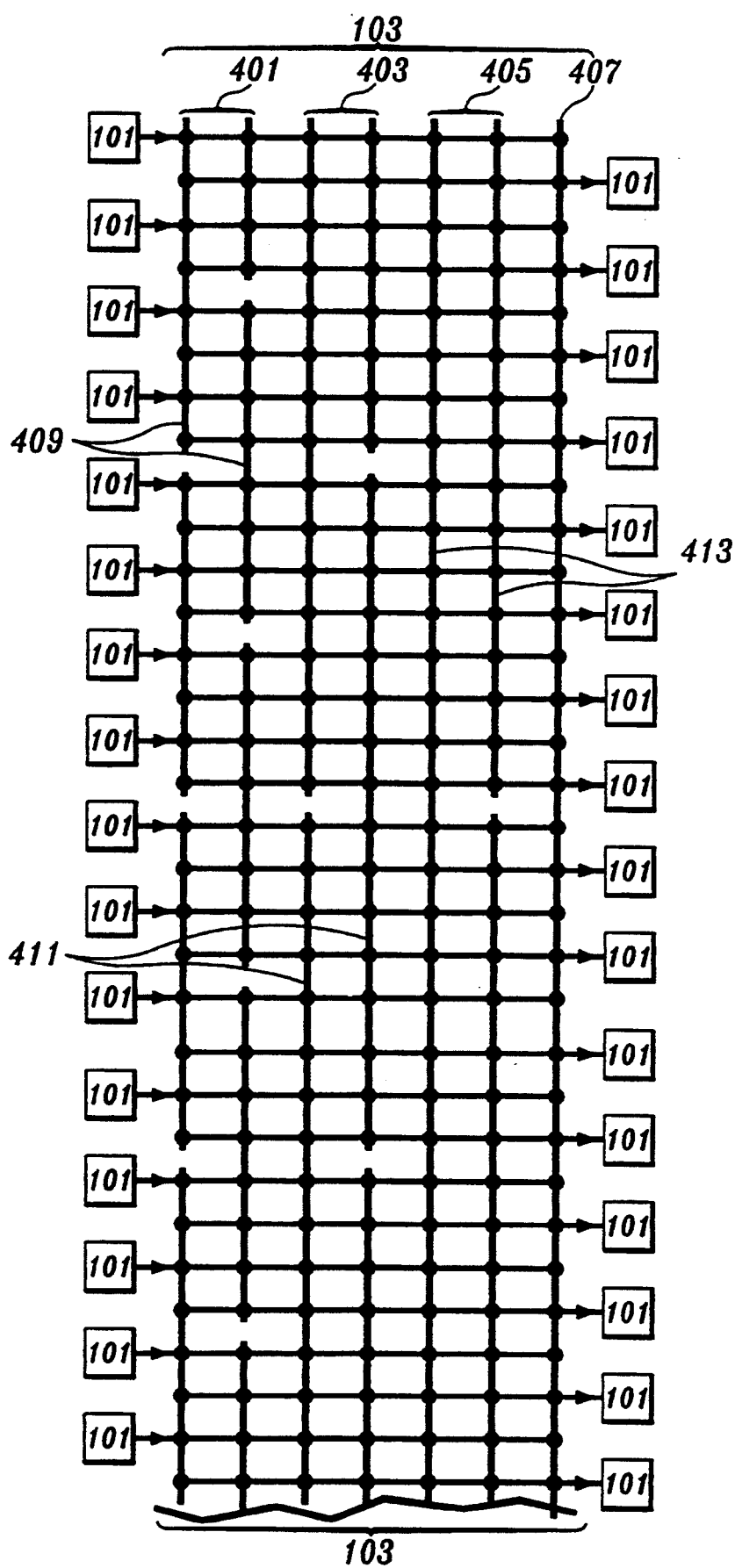
FIG. 8 illustrates the connection of the FPRLBs in two adjacent columns to a vertical segmented routing channel.

FIG. 8 illustrates in greater detail the structure of the FPSRC 103. For clarity, the BPRLBs 201 are omitted as is the BPSRC 105. The FPSRC 103 is comprised of seven distinct bus lines. Two of the bus lines are short bus lines 401. Each short bus line 401 is segmented into electrically isolated short segments 409 that are connected to eight FPRLBs 101. Two of the bus lines are medium bus lines 403. Each medium bus line 403 is segmented into electrically isolated medium segments 411 that are connected to sixteen FPRLBs 101. Two of the bus lines are long bus lines 405. Each long bus line 405 is segmented into electrically isolated long segments 413 that are connected to thirty-two FPRLBs 101. Finally, the last bus line is a global bus line 407 that is continuous throughout its length and connects to all FPRLBs 101 in the adjacent columns.

As seen in FIG. 8, each short segment 409 of a first short bus line 401 has connected thereto eight FPRLBs 101, four consecutive FPRLBs 101 from the column to the left and four consecutive FPRLBs 101 from the column to the right. Thus, in operation, one of the four consecutive FPRLBs 101 in the left column may provide an output signal onto the short segment 409. The four consecutive FPRLBs 101 in the column to the right may access the output signal provided.

Moreover, the second short bus line 401 has short segments 409 that are vertically offset from the short segments 409 in the first bus line 401. The vertical offset is equal to one-half of the length of short segment 409. Thus, short segments 409 in adjacent bus lines 401 are generally connected to four common FPRLBs 101.

Each medium segment 411 of a first medium bus line 403 has connected thereto sixteen FPRLBs 101, eight consecutive FPRLBs 101 from the column to the left and eight consecutive FPRLBs 101 from the column to the right. Thus, in operation, one of the eight consecutive FPRLBs 101 in the left column may provide an output signal onto the medium segment 411. The eight consecutive FPRLBs 101 in the column to the right may access the output signal provided.

Moreover, the second medium bus line 403 has medium segments 411 that are vertically offset from the medium segments 411 in the first medium bus line 403. The vertical offset is equal to one-half of the length of medium segment 411. Thus, medium segments 411 in adjacent medium bus lines 403 are connected to eight common FPRLBs 101.

Each long segment 413 of a first long bus line 405 has connected thereto thirty-two FPRLBs 101, sixteen consecutive FPRLBs 101 from the column to the left and sixteen consecutive FPRLBs 101 from the column to the right. Thus, in operation, one of the sixteen consecutive FPRLBs 101 in the left column may provide an output signal onto the long segment 413. The sixteen consecutive FPRLBs 101 in the column to the right may access the output signal provided.

Moreover, the second long bus line 405 has long segments 413 that are vertically offset from the long segments 413 in the first long bus line 405. The vertical offset is equal to one-half of the length of long segment 413. Thus, long segments 413 in adjacent long bus lines 405 are connected to sixteen common FPRLBs 101.

The global bus line 407 spans the entire length of the FPGA columns 107. Each FPRLB 101 in the adjacent columns are connected to the global bus line 407. Thus, in operation, one of the FPRLBs 101 in the left column may provide an output signal onto the global bus line 407. The FPRLBs 101 in the column to the right or routing channel I/O pad 117 may then access the output signal provided. Further, as will be seen below, routing channel I/O pad 117 may provide an input signal onto the global bus line 407 for access by the FPRLBs 101 in the column to the right.

The operation of FPSRCs 103 is to provide communication from each FPRLB 101 to the FPRLBs 101 in the adjacent right column. The communication may be accomplished via the short segments 409, the medium segments 411, the long segments 413, or the global bus line 407.

Although FIG. 8 illustrates only a FPSRC 103, the BPSRCs 105 are of identical configuration. Thus, the BPSRC 103 is also comprised of seven distinct bus lines. Two of the bus lines are short bus lines, segmented into electrically isolated short segments that connect to eight BPRLBs 201. Two of the bus lines are medium bus lines, segmented into electrically isolated medium segments that connect to sixteen BPRLBs 201. Two of the bus lines are long bus lines, segmented into electrically isolated long segments that connect to thirty-two RLBs 201. Finally, a continuous global bus line connects to all BPRLBs 201 in adjacent columns for use as a signal path.

Each short segment has connected thereto eight BPRLBs 201, four from the column to the left and four from the column to the right. Moreover, adjacent short bus lines are vertically offset from one another by one-half of the length of short segment. Thus, adjacent short segments in adjacent bus lines are connected to four common BPRLBs. Similarly, each medium segment has connected thereto sixteen BPRLBs 201, eight from the column to the left and eight from the column to the right. Moreover, adjacent medium bus lines are vertically offset from one another by one-half of the length of medium segment. Also, each long segment has connected thereto thirty-two BPRLBs 201, sixteen from the column to the left and sixteen from the column to the right. Moreover, adjacent medium bus lines are vertically offset from one another by one-half of the length of medium segment.

The operation of BPSRCs 105 is to provide communication from each BPRLB 201 to the BPRLBs 201 in the adjacent left column. The communication may be accomplished via the short segments, the medium segments, the long segments, or the global bus line 407.

Providing Input Signals to the FPGA

Returning to FIG. 1, input signals are provided to and output signals are extracted from the FPGA 11 via top-bottom I/O pads 111, routing channel I/O pads 117, and side I/O pads 113. As seen, side I/O pads 113 are disposed along both side peripheries of the FPGA 11, between the RLB rows 109. In particular, the side I/O pads 113 at the left periphery of the FPGA 11 are programmable to provide input signals to the diagonal input interconnects 151a and 151b of the FPRLBs 101. Side I/O pads 113 at the left periphery of the FPGA 11 are also programmable to receive output signals from the diagonal output interconnects 177a and 177b of the BPRLBs 201. Furthermore, the side I/O pads 113 at the left periphery of the FPGA 11 are programmable to receive output signals from the side segmented routing channel 115.

Similarly, the side I/O pads 113 at the right periphery of the FPGA 11 are programmable to provide input signals to the diagonal input interconnects 171a and 171b of the BPRLBs 201. Side I/O pads 113 at the right periphery of the FPGA 11 also are programmable to receive output signals from the diagonal output interconnects 157a and 157b of the FPRLBs 101. Further, the side I/O pads 113 at the right periphery of the FPGA 11 are programmable to receive output signals from the side segmented routing channel 115.

As seen in FIG. 1, top-bottom I/O pads 111 are disposed generally along the top and bottom edges of the FPGA 11, directly above or below the RLB columns 107, respectively. The top-bottom I/O pads 111 along the top periphery of the FPGA 11 are programmable to provide an input signal to the RLB directly below the top-bottom I/O pad 111. The same input signal is provided to the RLB in the top row of one of the two adjacent RLB column 107. Moreover, the top-bottom I/O pads 111 along the top periphery of the FPGA 11 are programmable to receive an output signal from the RLB directly below the top-bottom I/O pad 111. Another output signal is received from the RLB in the top row of the other adjacent RLB column 107.

The top-bottom I/O pads 111 along the bottom periphery of the FPGA 11 are programmable to provide an input signal to the RLB directly above the top-bottom I/O pad 111. The same input signal is provided to the RLB in the bottom row of one of the two adjacent RLB column 107. Moreover, the top-bottom I/O pads 111 along the bottom periphery of the FPGA 11 are programmable to receive an output signal from the RLB directly above the top-bottom I/O pad 111. Another output signal is received from the RLB in the bottom row of the other adjacent RLB column 107.

Routing channel I/O pads 117 are disposed generally along the top and bottom peripheries of the FPGA 11, between the columns 107. The routing channel I/O pads 117 along the top edge are programmable to provide input signals to and receive output signals from the global bus line 407 of the FPSRCs 103. The routing channel pads 117 along the bottom edge are programmable to provide input signals to and receive output signals from the global bus line 407 of the BPSRCs 105.

Side segmented routing channels 115 are disposed adjacent to the left and right peripheries of the FPGA 11. Side segmented routing channels 115, in the preferred embodiment, are identical in structure to the FPSRCs 103 and the BPSRCs 105. All seven bus lines of the side segmented routing channel 115 disposed along the left periphery of the FPGA 11 are connected to the FPSRC input interconnects 155 and the BPSRC output interconnects 181 of the FPRLBs 101 and the BPRLBs 201, respectively, in the left most RLB column 107 as shown in FIG. 1. All seven bus lines of the side segmented routing channel 115 disposed along the right periphery of the FPGA 11 are connected to the FPSRC output interconnects 161 and the BPSRC input interconnects 175 of the FPRLBs 101 and the BPRLBs 201, respectively, in the right most RLB column 107 as shown in FIG. 1.

The foregoing provides a complete description of the topology of a preferred FPGA for incorporating the present invention. However, as noted above, the present invention may be incorporated into a wide variety of FPGA topologies and the foregoing description of the preferred FPGA topology should not be construed as limiting.

Internal Structure of a RLB and a RAB

Figure 2:
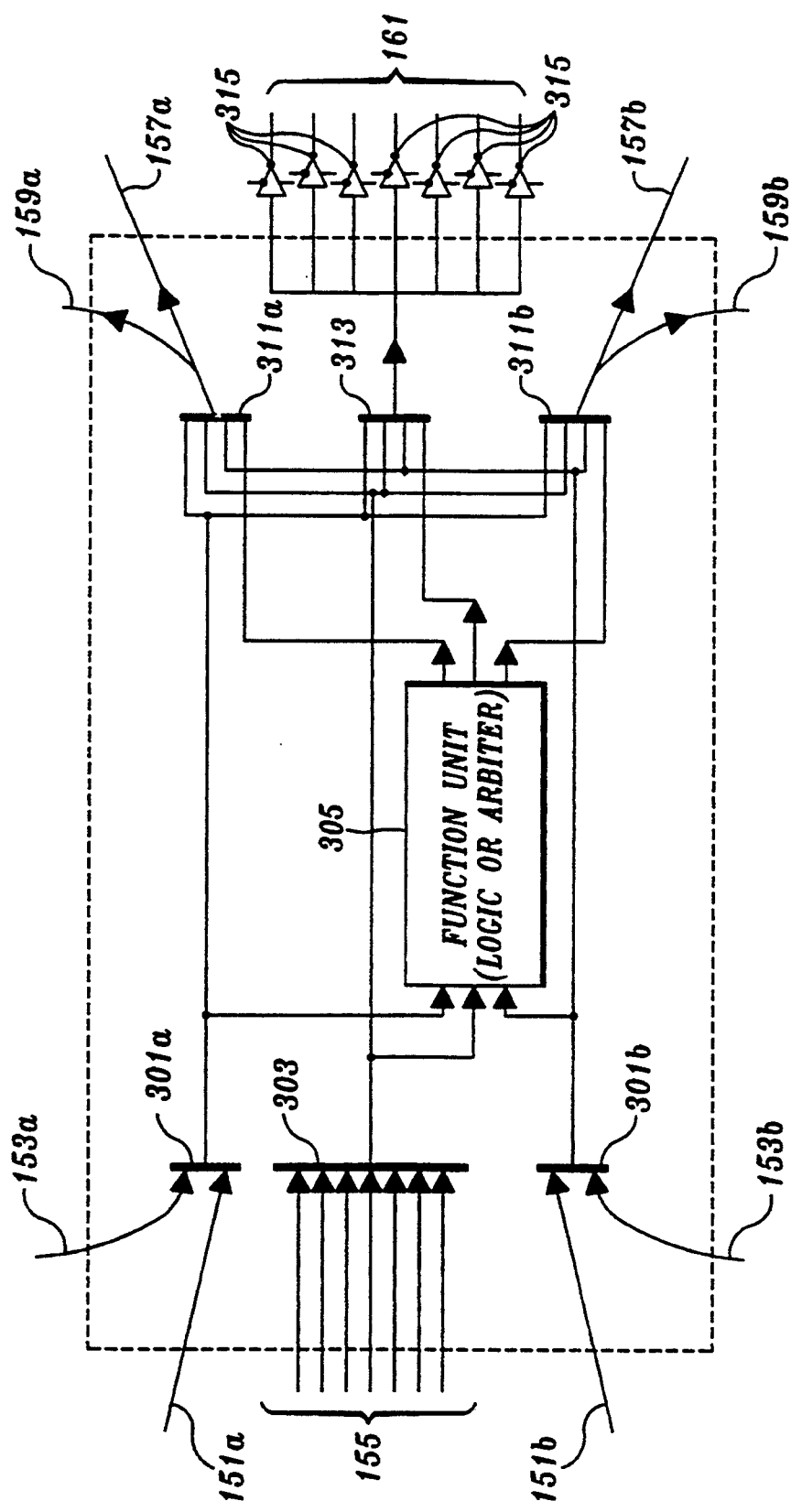
FIG. 2 is a schematic representation of the internal structure of a routing and logic block (RLB) and of a routing and arbiter block (RAB)

Referring to FIG. 2, the internal structure of the RLBs 101 and 201 and RABs 102 is shown. As will be seen in greater detail below, a function unit 305 of each RLB and RAB must be programmed so as to implement the desired logic function in the case of a RLB or a desired arbiter function in the case of a RAB. Also, a plurality of tri-state buffers 315 included in each RLB and RAB must be programmed, as well as multiplexers 301a, 301b, 303, 311a, 311b, and 313. As can be appreciated by those skilled in the art, the programmable elements have memory bits that are set by externally writing the information thereto. For clarity, the inputs that are used to write into memory are not shown. The method of programming a particular digital logic circuit is not of primary concern and various methods of accomplishing the same are known in the art.

The RLBs and the RABs have extremely similar internal structures and indeed, the only difference between the RLBs and the RABs is the internal configuration of the function unit 305. As noted above, the provision of a similar internal structure between the RLBs and the RABs greatly enhances the ease of manufacture for an FPGA as described herein. However, the specific internal layout and implementation of the RAB is not crucial, only that the RAB can perform at least an arbiter function. The RLBs and RABs are comprised of two input multiplexers 301a and 301b, an input routing channel multiplexer 303, a function unit 305, two output multiplexers 311a and 311b, and an output routing channel multiplexer 313. The multiplexers 301a, 301b, 303, 311a, 311b, and 313 are programmable elements that are operative to allow one signal to pass therethrough from a plurality of input signals presented.

In particular, each of the two input multiplexers 301a and 301b has two input signals. One input signal of input multiplexer 301a is carried by the diagonal input interconnect 151a (shown in FIG. 5). The diagonal input interconnect 151a carries an input signal from the RLB or RAB in the immediately adjacent leftward column and in the row above. The other input signal of input multiplexer 301a is carried by the vertical input interconnect 153a. The vertical input interconnect 153a carries an input signal from the RLB or RAB in the same column and immediately above the RLB or RAB. Input multiplexer 301a is programmable to select one of the two inputs to pass therethrough for further processing. As seen, the signal passed by input multiplexer 301a is provided to function unit 305, output multiplexers 311a and 311b, and output routing channel multiplexer 313.

Similarly, one input signal of input multiplexer 301b is carried by the diagonal input interconnect 151b (shown in FIG. 5). The diagonal input interconnect 151b carries an input signal from the RLB or RAB in the immediately adjacent leftward column and in the row below. The other input signal of input multiplexer 301b is carried by the vertical input interconnect 153b. The vertical input interconnect 153b carries an input signal from the RLB or RAB in the same column and immediately below as the RLB or RAB. Input multiplexer 301b is programmable to select one of the two inputs to pass therethrough for further processing. As seen, the signal passed by input multiplexer 301b is provided to function unit 305, output multiplexers 311a and 311b, and output routing channel multiplexer 313.

Next, input routing channel multiplexer 303 has seven inputs. The input routing channel multiplexer 303 accepts input signals provided by the FPSRC 103 adjacent and to the left of the RLB or RAB. The FPSRC 103 is comprised of seven individual bus lines. One input signal from each bus line is carried by input interconnect 155 to input routing channel multiplexer 303. Input routing channel multiplexer 303 is programmable to select any one of the seven inputs to pass therethrough for further processing. As seen, the signal passed by input routing channel multiplexer 303 is provided to function unit 305, output multiplexers 311a and 311b, and output routing channel multiplexer 313.

The operation of the multiplexers 301a, 301b, and 303 provide three input signals, respectively, to function unit 305. The first input signal is either the input signal carried on diagonal input interconnect 151a or the input signal carried on vertical input interconnect 153a. The second input signal is either the input signal carried on diagonal input interconnect 151b or the input signal carried on vertical input interconnect 153b. The third input signal is one of the input signals carried by the seven bus lines of FPSRC 103.

Output multiplexer 311a has as input signals the outputs of input multiplexers 301a, 301b, and 303. The output multiplexer 311a also has as an input signal one output of function unit 305. Output multiplexer 311a is programmable to select and output any one of the signals presented. Similarly, output multiplexer 311b has as input signals the outputs of input multiplexers 301a, 301b, and 303. The output multiplexer 311b also has as an input signal one output of function unit 305. Output multiplexer 311b is also programmable to select and output any one of the signals presented. Finally, output routing channel multiplexer 313 has as input signals the outputs of input multiplexers 301a, 301b, and 303. The output routing channel multiplexer 313 also has as an input signal one output of function unit 305. Output routing channel multiplexer 313 is also programmable to select and output any one of the signals presented.

The output of output routing channel multiplexer 313 is provided to FPSRC 103. As noted, the FPSRCs 103 and the BPSRCs 105 include seven bus lines. By the use of seven tri-state buffers 315, the output of output routing channel multiplexer 313 may be selectively applied to each of the seven bus lines. In particular, the tri-state buffers 315 act as a driver that either transmits a signal or does not transmit a signal onto the bus line.

In sum, it can be seen that three separate output signals are provided by a RLB or RAB, two by output multiplexers 311a and 311b, and one by output routing channel multiplexer 313. The first output signal provided by RLB output multiplexer 311a is provided to diagonal output interconnect 157a and to vertical output interconnect 159a. The second output signal provided by RLB output multiplexer 311b is provided to diagonal output interconnect 157b and to vertical output interconnect 159b. The third output signal provided by output routing channel multiplexer 313 is provided to the seven bus lines of FPSRC 103.

The RLBs and RABs are capable of performing both function calculation and routing tasks (in the case of a RLB) or both arbiter calculation and routing tasks (in the case of a RAB) simultaneously. For example, returning to FIG. 2, an input signal carried on diagonal input interconnect 151a may be routed, by appropriate programming of the multiplexers, to the two RLBs or RABs in the same column directly above and below via vertical output interconnects 159a and 159b, to the two RLBs or RABs in the next rightward column and in the row above and below via diagonal output interconnects 157a and 157b, or to more distant RLBs or RABs in the next rightward column by means of the FPSRC 103.

Figure 7A:
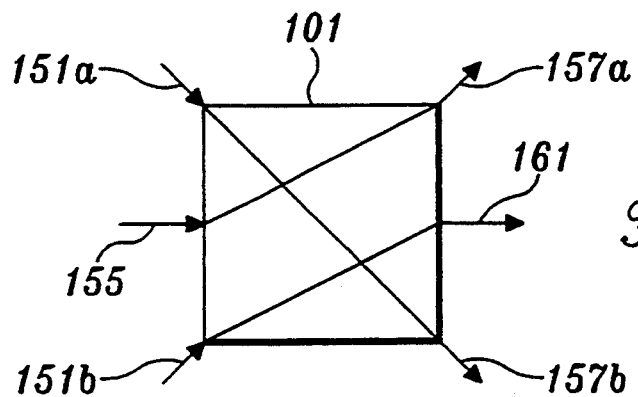
FIGS. 7A–7D illustrate several possible configurations for a routing and logic block (RLB)
Figure 7B:
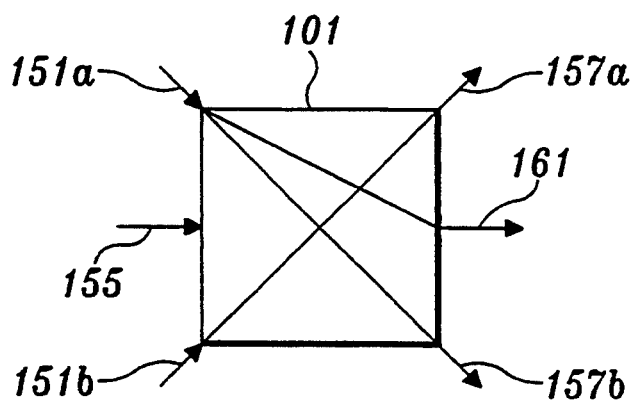

The routing flexibility leads to several possible uses for a RLB or RAB, as seen in FIGS. 7A–7D. In FIGS. 7A and 7B, the RLB or RAB may be used exclusively for routing purposes. Specifically, in FIG. 7A, an input signal provided via diagonal input interconnect 151a is routed as an output signal via diagonal output interconnect 157b. An input signal provided via FPSRC input interconnect 155 is routed to diagonal output interconnect 157a. Finally, an input signal provided by diagonal input interconnect 151b is routed as an output signal via FPSRC output interconnect 161. The internal structure of the RLBs and RABs provide for routing of input signals provided by the input interconnects to the output interconnects in numerous combinations. Moreover, a single input signal received may be routed to a plurality of output interconnects, as seen in FIG. 7B.

Figure 7C:
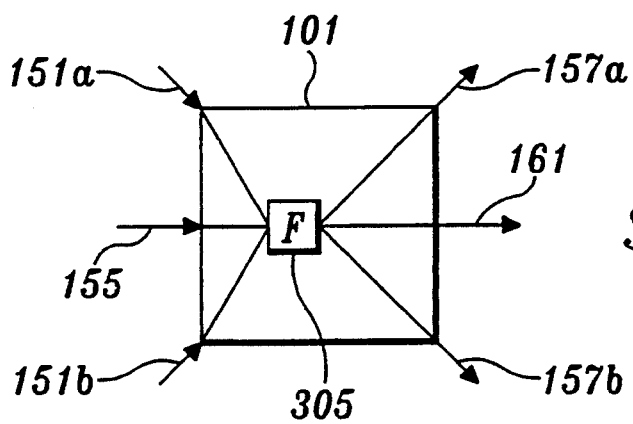
Figure 7D:
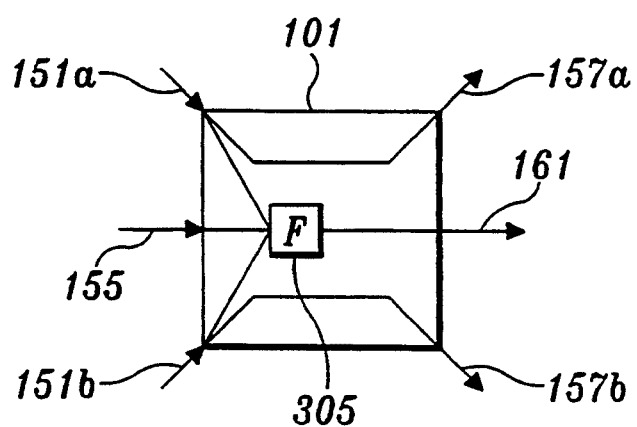

FIGS. 7C and 7D shows an RLB or RAB being used as a function unit (either logic or arbiter) and as a routing block. Specifically, in FIG. 7C, the function unit 305 provides an output to interconnects 157a, 157b, and 161. Finally, FIG. 7D shows another variation wherein RLB or RAB is used for signal propagation and for logic or arbiter calculation.

The Logic Function Unit for a RLB

Figure 3:
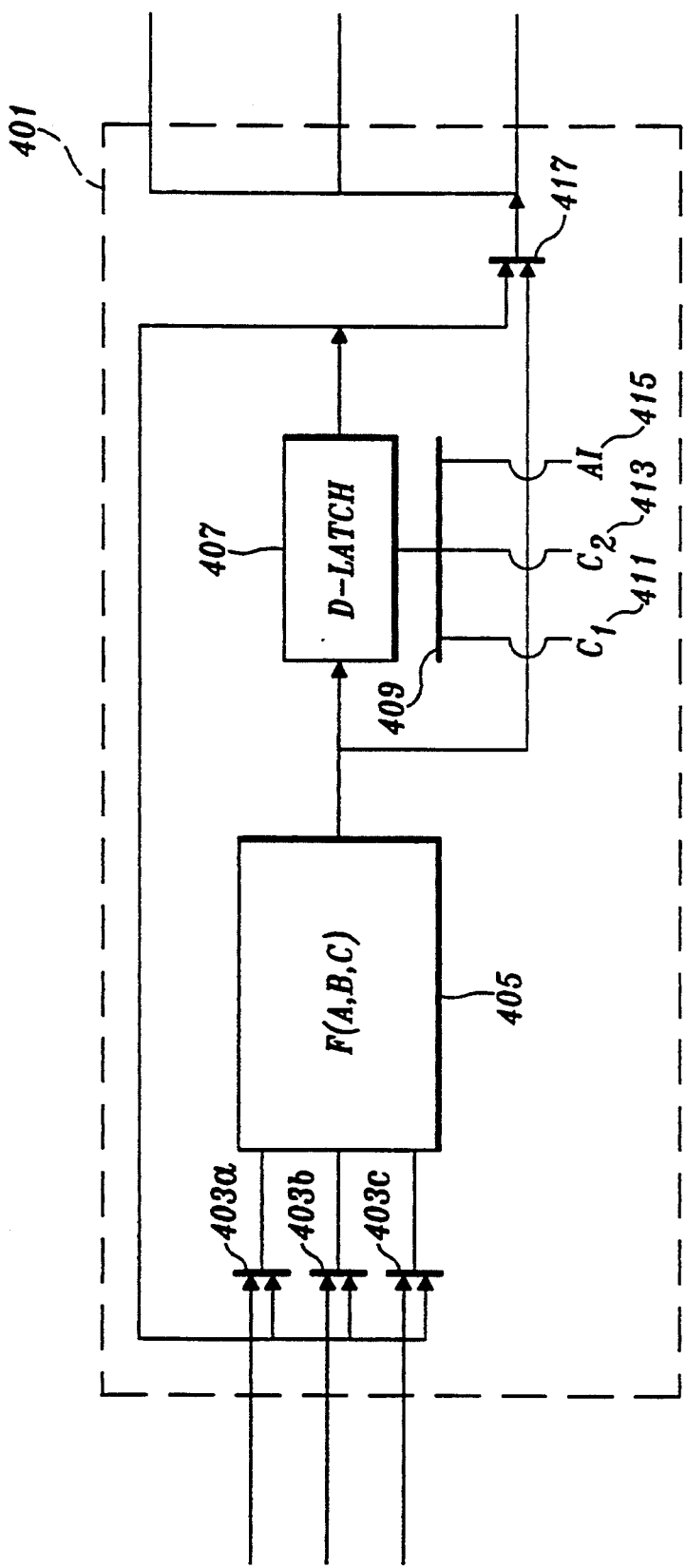
FIG. 3 is a schematic representation of the internal structure of the logic function unit within a routing and logic block (RLB)

As noted above, a RLB and a RAB differ only with respect to the construction and operation of the function unit 305. In particular, in the case of a RLB, the function unit 305 is a logic function unit 401 as shown in FIG. 3. The function unit 401 includes input multiplexers 403a, 403b, and 403c, transistor logic 405, latch 407, clock multiplexer 409, and output multiplexer 417. Input multiplexer 403a has as inputs the output of input multiplexer 301a (see FIG. 2) and the output of latch 407. Input multiplexer 403b has as inputs the output from multiplexer 303 (see FIG. 2) and the output from latch 407. Finally, input multiplexer 403c has as inputs the output from multiplexer 301b (see FIG. 2) and the output of latch 407. Each of the input multiplexers 403a-c are programmable to configure the logic function unit 401 to operate as either a predetermined combinational logic function or as a state holding element. The outputs from input multiplexer 403a-c are provided to transistor logic 405. Transistor logic 405 is operable to implement any logical function of three inputs such that the above referenced predetermined logic function may be implemented. Specific implementations of transistor logic 405 are well known in the art and the reader is directed to Machart et. al., *General Functions Circuit*, IBM T.D.B., Volume 15, No. 1, June 1972, page 11 and Gamblin et. al., *Thin Film Universal Logic Block*, IBM T.D.B., Volume 9, No. 6, November 1966, pp. 662–664 for further information.

One important requirement of the present invention is that the transistor logic 405 be hazard free. It can be appreciated by those skilled in the art that in order for an integrated circuit to operate asynchronously, any transient voltage effects within an integrated circuit operation must be either eliminated or accommodated. In particular, an asynchronous circuit responds to and depends upon voltage transistions in order to operate. Any transient voltages would nearly always cause an error in the asynchronous circuit. By use of a hazard free design for the transistor logic 405, asynchronous operation of the present invention is greatly facilitated. Several hazard free designs for the transistor logic 405 are known in the art and for further information, the reader is directed to McCluskey, *Logic Design Principles*, Prentice-Hall, 1986.

The output of digital logic block 405 is provided to latch 407. Latch 407 is provided so that logic function unit 401 can operate as a simple state holding element; either clocked or unclocked. Thus, the logic function unit 401 can operate so as to implement any three input digital logic function, optionally followed by a clocked latch, or alternatively, a two-input state holding function such as an asynchronous S-R flip-flop. The initial value of the latch can also be set during programming. Furthermore, output multiplexer 417 allows the user to program a logic function unit 401 to provide an output that is either directly from the digital logic block 405 or from the latch 407. In the case of a logic function unit 401, the output from output multiplexer 417 is provided as three separate outputs, as seen in FIG. 2.

The clock multiplexer 409 provides latch 407 with the ability to operate off of two separate two-phase clock signals. Alternatively, the clock multiplexer 409 provides latch 407 with the ability to operate off of an asynchronous initialization input 415. The clock inputs C1 411 and C2 413 are typically at two different clock rates. By providing the logic function until 401 with the ability to operate at two separate clock rates, the FPGA can interface between separately clocked components. Alternatively, the latch 407 can operate based upon the asynchronous initialization input 415. In this programming configuration, the logic function unit 401 is operating in asynchronous mode. Specifically, in the asynchronous mode, the latch 407 is set to a digital value during programming of the FPGA and continues to hold the output of the latch 407 to this digital value until sufficient time has expired for the logic function unit 401 to reach a valid operating state. Once the logic function unit 401 has been given enough time to stabilize, data is allowed to pass freely through the latches in asynchronous mode.

The Arbiter Function Unit for a RAB

Figure 4:
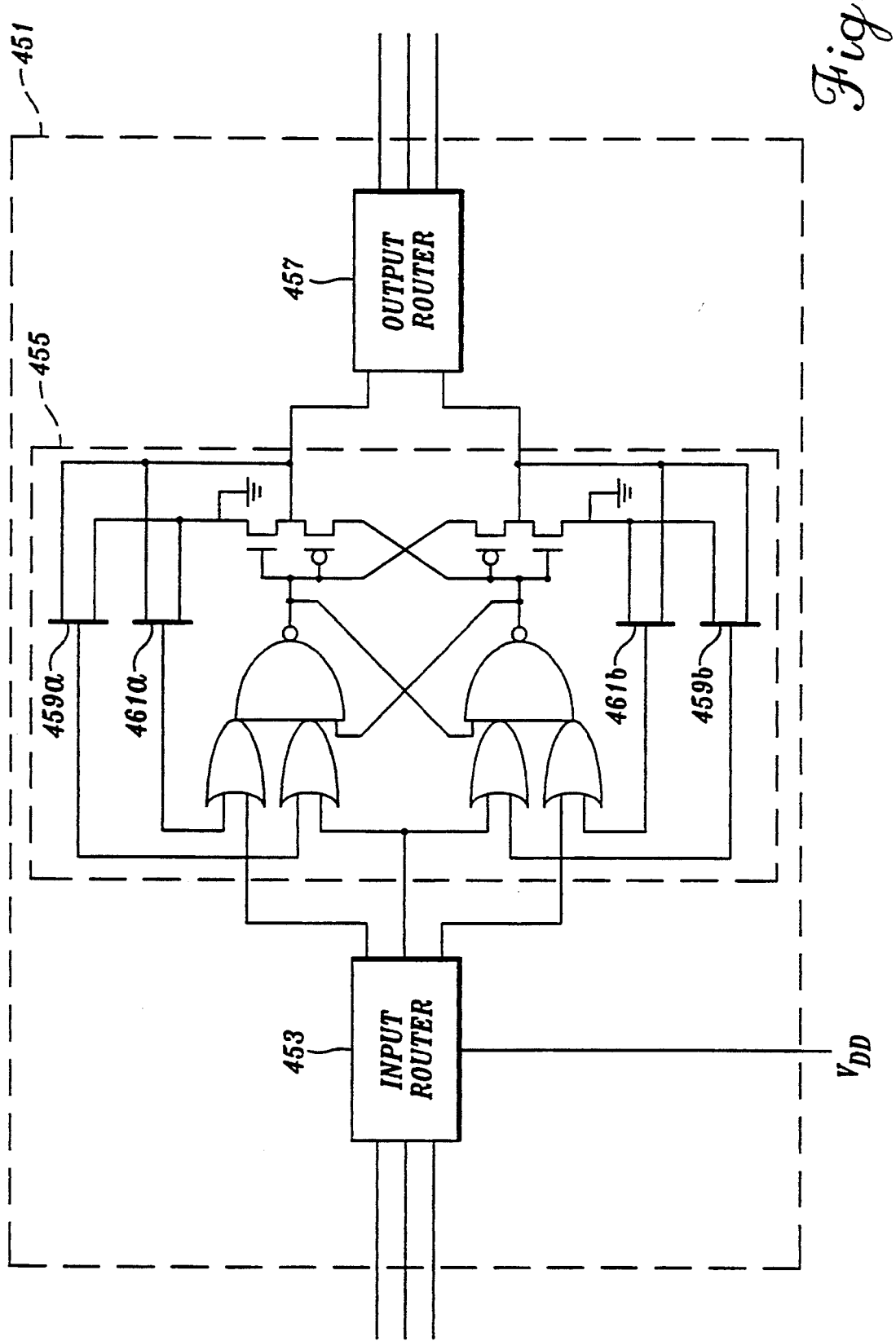
FIG. 4 is a schematic representation of the internal structure of the arbiter function unit within a routing and arbiter block (RAB)

In the case of a RAB, the function unit 305 is an arbiter function unit 451 as shown in FIG. 4. The arbiter function unit 451 comprises input router 453, arbiter stage 455, and output router 457. Input router 453 is operative such that the three inputs into arbiter function unit 451 may be selectively routed to any of the three inputs into arbiter stage 455. An additional input to input router 453 is a $V_{dd}$ signal which is always "high" or "one". This signal is provided such that a "one" is always available to be input into one or all of the inputs to arbiter stage 455. Any of the outputs of input router 453 may also be inverted. Arbiter stage 455 has two outputs. Output router 457 is operative such that the two outputs of arbiter stage 455 can be mapped to any or all of the three outputs of arbiter function unit 451.

The arbiter stage 455 as seen in FIG. 4 is a mutual exclusion circuit that is configured to behave in three separate configurations: (1) as an arbiter, (2) as an enabled arbiter, and (3) as a synchronizer. The arbiter stage 455 comprises a plurality of OR gates, NAND gates, transistors, and multiplexers. The general configuration of the NAND gates and transistors is known in the art. See Martin, *Programming in (VLSI). From Communicating Processes to Delay-Insensitive Circuits*, "Developments in Concurrency and Communication," Addison Wesley (1990), pp. 1–64. However, the preferred embodiment of the present invention further includes the OR gates and multiplexers. The provision of these additional elements is another feature of the present invention: the provision of an arbiter stage 455 that can, with proper input combinations generated by input router stage 453, alternatively be configured to provide the functionality of an arbiter, an enabled arbiter, or a synchronizer.

In order to configure the arbiter stage 455, the multiplexers must be programmed. In particular, outside multiplexers 459a and 459b and inside multiplexers 461a and 461b must be programmed. More specifically, in the case of an arbiter and an enabled arbiter, the outside multiplexers 459a and 459b are programmed to "pass-through" the output from the transistor combinations. Further, the inside multiplexers 461a and 461b are programmed to "pass-through" the signal from the ground (or a "zero" signal). In the case of a synchronizer, the outside multiplexers 459a and 459b are programmed to "pass-through" the signal from the ground and the inside multiplexers 461a and 461b are programmed to "pass-through" the signal from the transistor combinations.

With the programming of the arbiter stage 455 for each of the three configurations disclosed, the input/output characteristics of each of these operating configurations will now be addressed in turn. First, if the arbiter stage is configured as an arbiter, the middle input of the arbiter stage 455 is set to "one." The two active inputs are the upper and lower inputs. If the upper input is "zero" and the lower input is "zero," both of the outputs are "zero." Both outputs remain at "zero" until either one of the inputs becomes "one" at which time one of the outputs becomes "one."

If the upper input is "one" and the lower input is "zero," the upper output is "one" and the lower output is "zero." As long as the upper input remains "one," the upper output and lower output remain in this state regardless of whether the lower input becomes "one" at a later time. If the upper input is then "zero," then both the upper and lower outputs become "zero."

If the upper input is "zero" and the lower input is "one," the upper output is "zero" and the lower output is "one." As long as the lower input remains "one," the upper output and lower output remain in this state regardless of whether the upper input becomes "one" at a later time. If the lower input is then "zero," then both the upper and lower outputs become "zero."

If both the upper input and the lower input become "one" at nearly the same time, then randomly, one of the outputs becomes "one" and the other remains "zero." This is the critical feature of an arbiter. As can be appreciated, the arbiter chooses one of its outputs to become "one" while the other remains "zero" if the two inputs become "one" at nearly the same time.

Next, if the arbiter stage 455 is configured (via the four two-to-one multiplexers of arbiter stage 455) as an enabled arbiter, the behavior of the arbiter stage is as follows. The middle input to the arbiter stage 455 is the enable signal. The operation of the enable signal is to activate the arbiter circuit so as to operate. Thus, if the enable signal is "zero," then both outputs are always zero. However, if the enable output is "one," then the enabled arbiter behaves exactly like the arbiter described above, except if the enable signal becomes "zero" while either output is "one," that output will be unaffected. Once the enable signal is "zero," and the arbiter behavior dictates that both outputs should be "zero," neither output can become "one" until the enable signal is again set to "one."

Finally, if the arbiter stage 455 is configured (via the four two-to-one multiplexers of arbiter stage 455) as a synchronizer, the behavior of the arbiter stage is as follows. The data signal is routed via input router 453 to both the upper and lower input, with the lower signal inverted. The middle input is referred to as the enable input. If the enable input is "zero," then both of the outputs are "zero." Both outputs remain at "zero" until the enable input becomes "one." If the enable input is "one" and the upper input is "one," then the upper output is "one" and the lower output is "zero." If the enable input is "one" and the lower input is "one," then the upper output is "zero" and the lower output is "one." If both upper and lower inputs are "one" when the enable signal becomes "one," then the arbiter randomly sets one output to "one" while the other remains "zero." In any of the output cases, after the enable signal is set to "one," the outputs will remain in the given state until the enable signal is set to "zero," when both outputs are set to "zero." As can be appreciated by those skilled in the art, a synchronizer is useful to convert an asynchronous signal into a synchronous signal. In that instance, the enable input would be the synchronous clock input and the upper and lower inputs would be the asynchronous data input.

The behavior of an arbiter is well known in the art and in particular, the reader is directed to Martin, *Programming in (VLSI): From Communicating Processes to Delay-Insensitive Circuits*, "Developments in Concurrency and Communication," Addison Wesley (*1990*), pp. 1–64.

As noted above, the exact ratio of RABs and RLBs in a given FPGA may be variable. However, experience indicates that arbiters are used sparingly, so that only a small number are needed. An over abundance of RABs decreases the chip space available for RLBs, thereby limiting the computational power of the FPGA. Nevertheless, it has been determined that most applications of this particular FPGA architecture described above only utilizes approximately seventy-five (75) percent of the RLBs on the FPGA. Thus, if the number of RABs is somewhat smaller than twenty-five (25) percent, there will be little computational cost. Thus, the preferred embodiment of the present invention contemplates a 1:15 ratio, which provides sufficient RABs without sacrificing computational power.

The foregoing provides a complete description of one preferred embodiment of an FPGA that can operate synchronously and asynchronously. These FPGA's may be used to prototype complex integrated circuits, where the desired function is pre-programmed for testing. The FPGA of the present invention may also be used to handle random logic in circuit boards, where small computations, such as counters, simple state machines, etc. . . . are combined into a few FPGA chips, instead of using many TTL or similar small-scale integrated chips. Further, the FPGA of the present invention may also be used in situations where the logic must be altered, such as computer systems where bug fixes may later be applied, or generic interface cards, where the specific driver for the attached device is previously loaded. In cases where multiple clocks or asynchronous logic is involved, because there are no prior art FPGAs that can operate asynchronously, the prior art FPGAs are unsuited for the above applications.

While the preferred embodiment of the invention has been illustrated and described, it will be appreciated that various changes can be made therein without departing from the spirit and scope of the invention. Thus, the invention can be practiced other that as specifically described herein.

The embodiments of the invention in which an exclusive property or privilege is claimed are defined as follows:

1. A field programmable gate array (FPGA) having at least one logic block, each of said logic blocks having inputs for receiving a plurality of input signals and outputs for outputting a plurality of output signals, the FPGA further comprising:
    (a) at least one arbiter block, said arbiter block having inputs for receiving a plurality of input signals and outputs for outputting a plurality of output signals, and wherein said arbiter block is programmable to provide an arbiter function, an enabled arbiter function, or a synchronizer function; and
    (b) interconnect resources for providing electrical communication between said inputs of either said arbiter blocks or logic blocks and the outputs of either said arbiter blocks or logic blocks.

2. The FPGA of claim 1 wherein said logic blocks are further capable of calculating logical functions and routing of said input signals.

3. The FPGA of claim 1 wherein said arbiter blocks are further capable of routing said input signals.

4. The FPGA of claim 1 wherein the ratio of said arbiter blocks to said logic blocks is between 5% and 10%.

5. A method of providing a field programmable gate array (FPGA) for synchronous and asynchronous operation, said FPGA comprising a plurality of logic blocks, each of said logic blocks having inputs for receiving a plurality of input signals and outputs for outputting a plurality of output signals, said method comprising the step of:
    (a) replacing at least one of said logic blocks with an arbiter block, said arbiter block having inputs for receiving a plurality of input signals and outputs for outputting a plurality of output signals.

6. The method of claim 5 wherein said replacement of said logic blocks is done in a random nature.

7. The method of claim 6 wherein 5% to 10% of said logic blocks are replaced by said arbiter blocks.

8. A field programmable gate array comprising:
    (a) a plurality of forwardly propagating routing and logic blocks (FPRLBs), each of said FPRLBs having inputs for receiving a plurality of input signals and outputs for outputting a plurality of output signals; and
    (b) a plurality of backwardly propagating routing and logic blocks (BPRLBs), each of said BPRLBs having inputs for receiving a plurality of input signals and outputs for outputting a plurality of output signals, said BPRLBs intermeshing with said FPRLBs to form a two-dimensional checkerboard array, wherein the columns of said checkerboard array comprise a plurality of FPRLBs and BPRLBs arranged in alternating sequence and the rows of said checkerboard array comprise a plurality of FPRLBs and BPRLBs arranged in alternating sequence;
    wherein each of said FPRLBs not on the periphery of said checkerboard array is communicatively connected to a plurality of BPRLBs in the same column such that said input signals and said output signals may be passed therebetween, wherein each of said BPRLBs not on the periphery of said checkerboard array is communicatively connected to a plurality of FPRLBs in the same column such that said input signals and said output signals may be passed therebetween, wherein each of said FPRLBs not on the periphery of said checkerboard array is communicatively connected to a plurality of FPRLBs in the immediately adjacent leftward column such that said input signals may be received therefrom and a plurality of FPRLBs in the immediately adjacent rightward column such that said output signals may be transmitted thereto, and wherein each of said BPRLBs not on the periphery of said checkerboard array is communicatively connected to a plurality of BPRLBs in the immediately adjacent leftward column such that said output signals may be transmitted thereto and a plurality of BPRLBs in the immediately adjacent rightward column such that said input signals may be received therefrom;
    further wherein a predetermined ratio of said FPRLBs and BPRLBs is substituted therefore by a plurality of routing and arbiter blocks (RABs).

9. The apparatus of claim 8, further including a plurality of segmented routing channels, said segmented routing channels disposed between the columns of said checkerboard array, said segmented routing channels for receiving said output signals from and providing said input signals to said FPRLBs and BPRLBs in the columns of said checkerboard array immediately adjacent to the individual said segmented routing channels.

10. The apparatus of claim 9, wherein each of said FPRLBs not on the periphery of said checkerboard array provides said output signals to and receives said input signals from two said BPRLBs in the same column and that are directly adjacent above and below; and wherein each of said BPRLBs not on the periphery of said checkerboard array provides said output signals to and receives input signals from two said FPRLBs in the same column and that are directly adjacent above and below.

11. The apparatus of claim 9, wherein each of said FPRLBs not on the periphery of said checkerboard array provides said output signals to two said FPRLBs located in the immediately adjacent rightward column and that are in adjacent rows immediately above and below;

wherein each of said FPRLBs not on the periphery of said checkerboard array receives said input signals from two said FPRLBs located in the immediately adjacent leftward column and that are in adjacent rows immediately above and below;

wherein each of said BPRLBs not on the periphery of said checkerboard array provides said output signals to two said BPRLBs located in the immediately adjacent leftward column and that are in adjacent rows immediately above and below; and wherein each of said BPRLBs not on the periphery of said checkerboard array receives said input signals from two said BPRLBs located in the immediately adjacent rightward column and that are in adjacent rows immediately above and below.

12. The apparatus of claim 9, wherein said segmented routing channels include a forwardly propagating segmented routing channel (FPSRC) and a backwardly propagating segmented routing channel (BPSRC);

said FPSRC for receiving said output signals from said FPRLBs in the immediately adjacent leftward column and providing said input signals to said FPRLBs in the immediately adjacent rightward column; and said BPSRC for receiving said output signals from said BPRLBs in the immediately adjacent rightward column and providing said input signals to said BPRLBs in the immediately adjacent leftward column.

13. The apparatus of claim 12, wherein both said FPSRCs and said BPSRCs include a plurality of separate segmented bus lines.

14. The apparatus of claim 13 wherein said FPSRCs and said BPSRCs share at least one bus line.

15. The apparatus of claim 9, wherein said FPRLBs and said BPRLBs are programmable to provide said output signals as a logic function of said input signals; and wherein said FPRLBs and said BPRLBs are programmable to route said input signals that are received to other said FPRLBs and said BPRLBs.

16. The apparatus of claim 15, further including a plurality of I/O pads disposed along the side periphery of said field programmable gate array, said I/O pads for receiving said output signals from and providing said input signals to the FPRLBs and BPRLBs disposed in the left most and right most columns of said checkerboard array.

17. The apparatus of claim 16, further including a plurality of routing channel I/O pads disposed along the top and bottom periphery of said checkerboard array, said I/O pads for providing said input signals to and receiving output signals from said segmented routing channels.

18. The apparatus of claim 17, further including a plurality of top-bottom I/O pads disposed along the top and bottom periphery of said checkerboard array for providing said input signals to and receiving said output signals from said FPRLBs and BPRLBs disposed in the top most and bottom most rows of said checkerboard array.

* * * * *